(12) United States Patent
Kang et al.

(10) Patent No.: US 11,910,634 B2
(45) Date of Patent: Feb. 20, 2024

(54) DISPLAY DEVICE AND MANUFACTURING METHOD THEREOF

(71) Applicant: LG Display Co., Ltd., Seoul (KR)

(72) Inventors: Daeil Kang, Paju-si (KR); Joungwon Woo, Paju-si (KR); Soojin Kim, Paju-si (KR); Samjong Lee, Paju-si (KR); Dojoong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 155 days.

(21) Appl. No.: 17/535,117

(22) Filed: Nov. 24, 2021

(65) Prior Publication Data

US 2022/0209170 A1   Jun. 30, 2022

(30) Foreign Application Priority Data

Dec. 31, 2020   (KR) .......................... 10-2020-0188609

(51) Int. Cl.
| | | |
|---|---|---|
| *H01L 29/08* | (2006.01) | |
| *H10K 50/814* | (2023.01) | |
| *H10K 50/16* | (2023.01) | |
| *H10K 50/824* | (2023.01) | |
| *H10K 59/122* | (2023.01) | |
| *H10K 71/00* | (2023.01) | |

(52) U.S. Cl.
CPC .......... *H10K 50/814* (2023.02); *H10K 50/16* (2023.02); *H10K 50/824* (2023.02); *H10K 59/122* (2023.02); *H10K 71/00* (2023.02)

(58) Field of Classification Search
CPC .... H10K 59/122; H10K 50/814; H10K 50/16; H10K 50/824; H10K 71/10
USPC .......................................................... 257/40
See application file for complete search history.

(56) References Cited

U.S. PATENT DOCUMENTS

2019/0348627 A1* 11/2019 Lee ...................... H10K 50/824
2020/0212131 A1   7/2020 Kim et al.

FOREIGN PATENT DOCUMENTS

| KR | 10-2020-0080896 A | | 7/2020 |
| KR | 20150030440 A | * | 1/2023 |

* cited by examiner

*Primary Examiner* — Phuc T Dang
(74) *Attorney, Agent, or Firm* — Birch, Stewart, Kolasch & Birch, LLP

(57) ABSTRACT

A display device can include a substrate having a light emitting area and a non-light emitting area; an anode electrode disposed in the light emitting area; a metal layer disposed in the non-light emitting area and connected to a first driving power; an auxiliary electrode disposed on the metal layer and including at least one electrode hole exposing the metal layer; a bank disposed on an edge region of the anode electrode and an edge region of the auxiliary electrode; a light emitting layer disposed on a region of the anode electrode exposed by the bank; an electron transport layer disposed on the light emitting layer and the auxiliary electrode; and a cathode electrode disposed on the electron transport layer, in which the electron transport layer is in direct contact with the metal layer through the at least one electrode hole.

12 Claims, 10 Drawing Sheets

DISPLAY DEVICE AND MANUFACTURING METHOD THEREOF

CROSS REFERENCE TO RELATED APPLICATION

The present application claims priority to Korean Patent Application No. 10-2020-0188609, filed Dec. 31, 2020, in the Republic of Korea, the entire contents of which are incorporated by reference into the present application.

BACKGROUND

Field of the Invention

The present disclosure relates to a display device and a manufacturing method thereof.

Description of the Related Art

With the continuing development of an information-oriented society, various types of display devices are being developed. Recently, a variety of display devices, such as a liquid crystal display (LCD), a plasma display panel (PDP), and an organic light emitting display (OLED), are being used.

An organic light emitting device constituting the OLED emits light by itself without a separate light source (e.g., no backlight needed), and thus, the OLED can be thinner and lighter. Also, the OLED shows high quality characteristics, such as low power consumption, a high luminance, and high response speed, etc.

SUMMARY OF THE DISCLOSURE

Embodiments provide a display device which includes a metal layer and a patterned anode electrode structure and connects a cathode electrode and an auxiliary electrode by laser irradiation, and a manufacturing method thereof.

One embodiment is directed to a display device including a substrate including a light emitting area and a non-light emitting area; a metal layer which is disposed in the non-light emitting area and is connected to a low potential driving power; an auxiliary electrode which covers the metal layer and includes at least one electrode hole exposing the metal layer; an electron transport layer which covers the auxiliary electrode; and a cathode electrode which is formed on the electron transport layer. The electron transport layer is in contact with the metal layer through the electrode hole.

The bank is formed to cover the edge region of the auxiliary electrode and exposes a central region of the auxiliary electrode.

The bank is formed to expose all or some regions of the electrode hole.

The electron transport layer is formed to cover the central region of the auxiliary electrode and the bank.

In the electron transport layer, a thickness on the auxiliary electrode is less than a thickness on the bank.

On the electrode hole, the electron transport layer is formed such that a height of a surface of the electron transport layer is less than that of the periphery.

The metal layer is made of molybdenum titanium. The electrode hole has a curved shape on a plane, and both ends of the electrode hole are disposed adjacent to other electrode holes, respectively.

The electrode hole has a circular shape, an elliptical shape or polygonal shapes, and both sides of the electrode hole are disposed adjacent to other electrode holes.

The auxiliary electrode includes a first layer formed of a transparent conductive material; a second layer formed of a metal oxide; and a third layer formed of the transparent conductive material.

The electron transport layer is in direct contact with the second layer exposed through a sidewall of the electrode hole.

Another embodiment is directed to a manufacturing method of the display device. The manufacturing method includes forming, on a substrate, a metal layer connected to a low potential driving power; forming an auxiliary electrode which covers the metal layer and includes at least one electrode hole exposing the metal layer; forming a bank which covers an edge region of the auxiliary electrode and exposes a central region of the auxiliary electrode; forming an electron transport layer which covers the central region of the auxiliary electrode and the bank; and forming a cathode electrode on the electron transport layer.

The electron transport layer is formed on the electrode hole, without filling the electrode hole.

The manufacturing method further includes irradiating a laser to the substrate after forming the cathode electrode.

The metal layer transfers energy caused by the laser to the electron transport layer, and the electron transport layer is melted by the energy and flows into the electrode hole.

The electron transport layer is in contact with the metal layer through the electrode hole. The metal layer is made of molybdenum titanium. The bank is formed to expose all or some regions of the electrode hole.

DETAILED DESCRIPTION OF THE EMBODIMENTS

Figure 1:
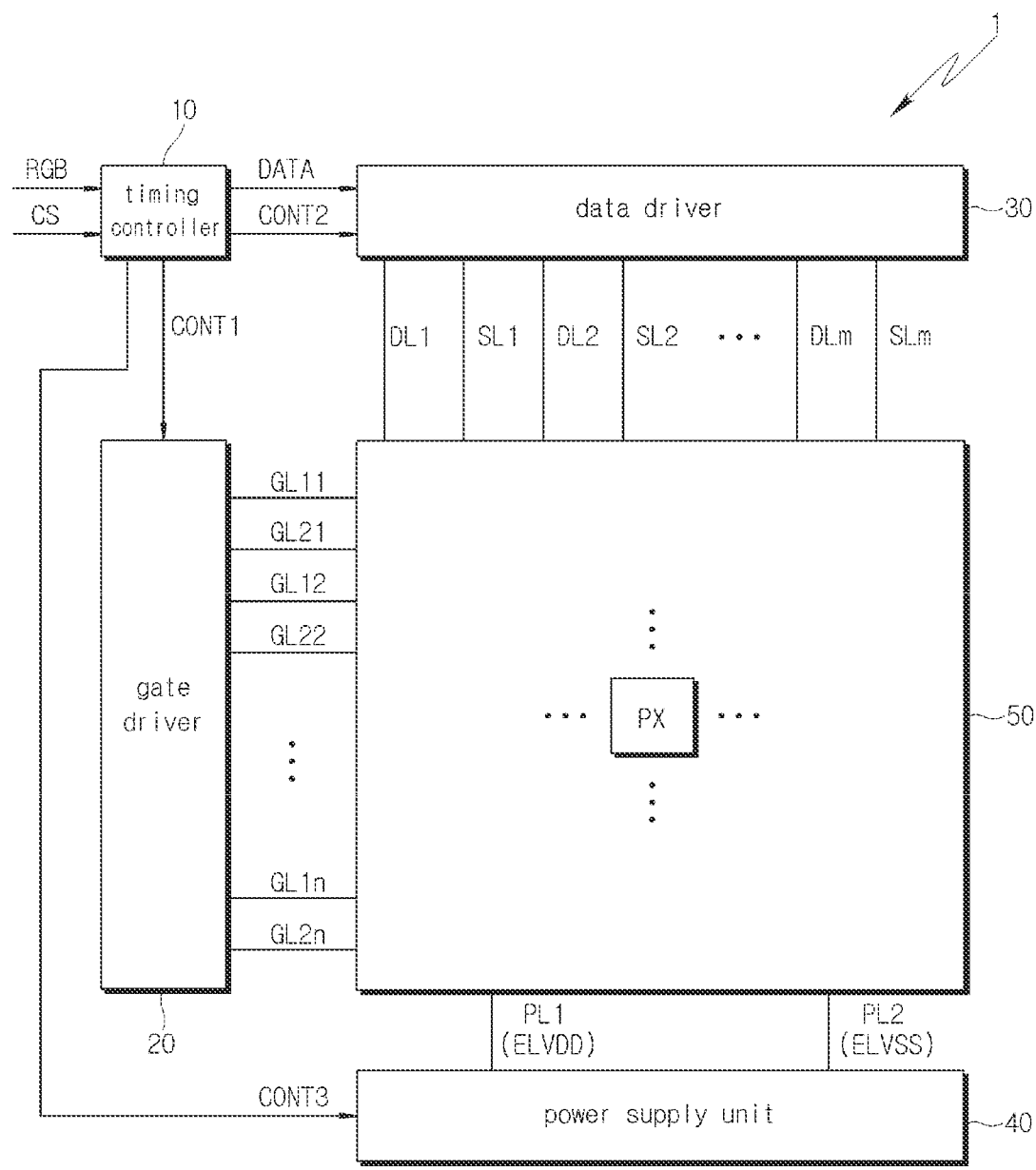
FIG. 1 is a block diagram showing a configuration of a display device according to an embodiment of the present disclosure.

Hereinafter, embodiments of the present disclosure will be described with reference to the accompanying drawings.

In this specification, when it is mentioned that a component (or region, layer, portion) "is on," "is connected to," or "is combined with" another component, terms "is on," "connected to," or "combined with" mean that a component may be directly connected to/combined with another component or mean that a third component may be disposed between them.

The same reference numerals correspond to the same components. Also, in the drawings, the thicknesses, ratios, and dimensions of the components are exaggerated for effective description of the technical details. A term "and/or" includes all of one or more combinations that related configurations can define.

While terms such as the first and the second, etc., can be used to describe various components, the components are not limited by the terms mentioned above. The terms are used only for distinguishing between one component and other components. For example, the first component may be designated as the second component without departing from the scope of rights of various embodiments. Similarly, the second component may be designated as the first component. An expression of a singular form includes the expression of plural form thereof unless otherwise explicitly mentioned in the context.

Terms such as "below," "lower," "over," "above," "upper" and the like are used to describe the relationships between the components shown in the drawings. These terms have relative concepts and are described based on directions indicated in the drawings.

In the present specification, it should be understood that the term "include" or "comprise" and the like is intended to specify characteristics, numbers, steps, operations, components, parts or any combination thereof described in the specification, and intended not to previously exclude the possibility of existence or addition of at least one another characteristics, numbers, steps, operations, components, parts or any combination thereof.

FIG. 1 is a block diagram showing a configuration of a display device according to an embodiment of the present disclosure.

Referring to FIG. 1, a display device 1 includes a timing controller 10, a gate driver 20, a data driver 30, a power supply unit 40, and a display panel 50.

The timing controller 10 can receive an image signal RGB and a control signal CS from the outside (e.g., from a host system). The image signal RGB can include a plurality of grayscale data. The control signal CS can include, for example, a horizontal synchronization signal, a vertical synchronization signal, and a main clock signal.

The timing controller 10 can process the image signal RGB and the control signal CS in conformity with operation conditions of the display panel 50, and then can generate and output an image data DATA, a gate driving control signal CONT1, a data driving control signal CONT2, a power supply control signal CONT3.

The gate driver 20 can generate gate signals based on the gate driving control signal CONT1 output from the timing controller 10. The gate driver 20 can provide the generated gate signals to pixels PX through a plurality of first gate lines GL11 to GL1n. The gate driver 20 can provide sensing signals to the pixels PX through a plurality of second gate lines GL21 to GL2n, where n is a positive integer. The sensing signal can be provided to measure characteristics of a driving transistor and/or a light emitting device provided within the pixels PX.

The data driver 30 can generate data signals based on the image data DATA and the data driving control signal CONT2 output from the timing controller 10. The data driver 30 can provide the generated data signals to the pixels PX through a plurality of data lines DL1 to DLm, where m is a positive integer. The data driver 30 can provide a reference voltage (or a sensing voltage, an initialization voltage) to the pixels PX through a plurality of sensing lines SL1 to SLm or can sense the state of the pixels PX based on electrical signals fed back from the pixels PX.

The power supply unit 40 can generate a high potential driving voltage ELVDD and a low potential driving voltage ELVSS which are to be provided to the display panel 50 based on the power supply control signal CONT3. The power supply unit 40 can provide the generated driving voltages ELVDD and ELVSS to the pixels PX through corresponding power lines PL1 and PL2.

A plurality of pixels PX (or referred to as subpixels) are disposed on the display panel 50. The pixels PX can be arranged, for example, in a matrix form on the display panel 50. The pixels PX can emit light with a luminance which corresponds to the gate signal and the data signal provided through the first gate lines GL11 to GL1n and the data lines DL1 to DLm.

In the embodiment, each pixel PX can represent any one of red, green, and blue colors. In another embodiment, each pixel PX can represent any one of cyan, magenta, and yellow colors. In various embodiments, each pixel PX can represent any one of red, green, blue, and white colors.

The timing controller 10, the gate driver 20, the data driver 30, and the power supply unit 40 can be each composed of a separate integrated circuit (IC), or can be configured as an IC in which at least some of them are integrated. Also, at least one of the gate driver 20 and the data driver 30 can be implemented in an in-panel method where it is formed integrally with the display panel 50.

Figure 2:
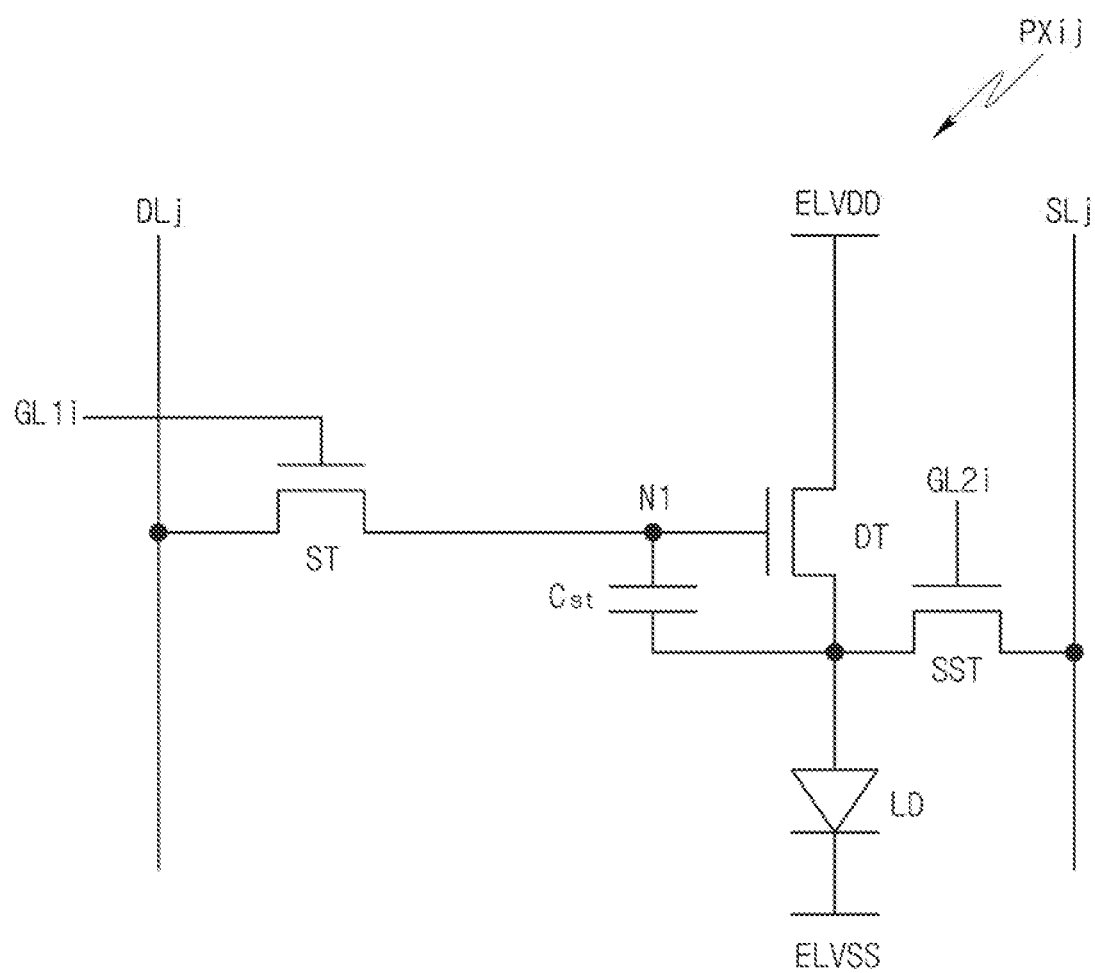
FIG. 2 is a circuit diagram showing a pixel shown in FIG. 1 according to an embodiment of the present disclosure.

FIG. 2 is a circuit diagram showing an embodiment of a pixel shown in FIG. 1. FIG. 2 shows the pixel PXij connected to the first i-th gate line GL1i and the j-th data line DLj as an example, wherein i and j are positive integers.

Referring to FIG. 2, the pixel PX includes a switching transistor ST, a driving transistor DT, a sensing transistor SST, a storage capacitor Cst, and a light emitting device LD (e.g., an OLED).

A first electrode of the switching transistor ST is electrically connected to the j-th data line DLj, and a second electrode of the switching transistor ST is electrically connected to a first node N1. A gate electrode of the switching transistor ST is electrically connected to the first i-th gate line GL1i. The switching transistor ST is turned on when a gate signal of a gate-on level is applied to the first i-th gate line GL1i, and transmits the data signal applied to the j-th data line DLj to the first node N1.

A first electrode of the storage capacitor Cst is electrically connected to the first node N1, and a second electrode of the storage capacitor Cst is electrically connected to a first electrode of the light emitting device LD. The storage capacitor Cst can be charged with a voltage corresponding to a difference between the voltage applied to the first node N1 and the voltage applied to the first electrode of the light emitting device LD.

A first electrode of the driving transistor DT is configured to receive the high potential driving voltage ELVDD, and a second electrode of the driving transistor DT is electrically connected to the first electrode (e.g., the first electrode) of the light emitting device LD. A gate electrode of the driving transistor DT is electrically connected to the first node N1. The driving transistor DT can be turned on when a gate-on level voltage is applied through the first node N1, and can control the amount of driving current flowing through the light emitting device LD in response to the voltage applied to the gate electrode.

A first electrode of the sensing transistor SST is electrically connected to the j-th sensing line SLj, and a second electrode of the sensing transistor SST is electrically connected to the first electrode (e.g., an anode electrode) of the light emitting device LD. A gate electrode of the sensing transistor SST is electrically connected to the second i-th gate line GL2i. The sensing transistor SST is turned on when a sensing signal of a gate-on level is applied to the second i-th gate line GL2i, and transmits a reference voltage applied to the j-th sensing line SLj to the first electrode of the light emitting device LD.

The light emitting device LD outputs light corresponding to the driving current. The light emitting device LD can output light corresponding to any one of red, green, blue, and white colors. The light emitting device LD can be an organic light emitting diode (OLED) or a micro inorganic light emitting diode having a size in a range from micro scale to nano scale. However, the present embodiment is not limited thereto. Hereinafter, the technical spirit of the present invention will be described with reference to the embodiment in which the light emitting device LD is composed of the organic light emitting diode.

In the embodiment, the structure of the pixels PXij is not limited to what is shown in FIG. 2. According to the embodiment, the pixels PXij can further include at least one element for compensating a threshold voltage of the driving transistor DT or initializing the voltage of the gate electrode of the driving transistor DT and/or the voltage of the first electrode of the light emitting device LD.

FIG. 2 shows an example in which the switching transistor ST, the driving transistor DT, and the sensing transistor SST are NMOS transistors. However, the present invention is not limited thereto. For example, at least some or all of the transistors constituting each pixel PX can be composed of a PMOS transistor. In various embodiments, each of the switching transistor ST, the driving transistor DT, and the sensing transistor SST can be implemented with a low temperature poly silicon (LTPS) thin film transistor, an oxide thin film transistor, or a low temperature polycrystalline oxide (LTPO) thin film transistor.

Figure 3:
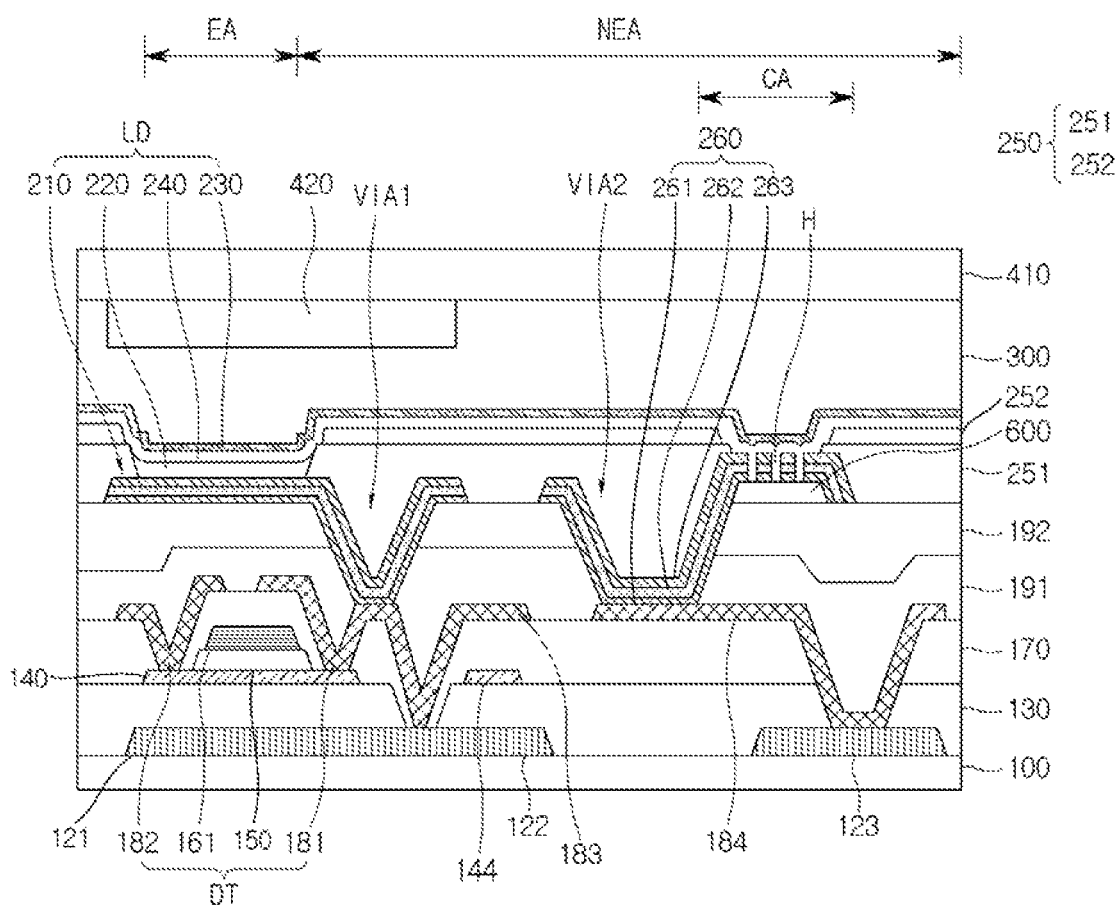
FIG. 3 is a cross sectional view of a display panel according to an embodiment of the present disclosure.

FIG. 3 is a cross sectional view of the display panel according to an embodiment of the present disclosure.

Referring to FIG. 3, the pixel PX according to the embodiment includes a substrate 100, a circuit element layer formed on the substrate 100 and provided with at least one circuit element, and a light emitting device layer including the light emitting device LD.

The substrate 100 is a base material of the display panel 50 and can be a light-transmitting substrate. The substrate 100 can be a rigid substrate including glass or tempered glass or a flexible substrate made of plastic.

The circuit element layer is formed on the substrate 100 and can include circuit elements (e.g., transistors, capacitors, etc.) and wirings which constitute the pixel PX.

A first conductive layer can be disposed on the substrate 100. The first conductive layer can include a lower electrode 122 of the storage capacitor Cst, an auxiliary wiring 123, and a light shielding layer 121 on the lower electrode 122 and the auxiliary wiring 123 or integrated therein. The auxiliary wiring 123 can be connected to the second power line PL2 to which the low potential driving voltage ELVSS is applied (e.g., also see FIG. 1). The light shielding layer 121 is disposed to overlap an active layer 140, in particular, a channel on a plane, thereby protecting an oxide semiconductor device from external light. The lower electrode 122 of the storage capacitor Cst can be integrally formed with the light shielding layer 121 as one pattern. However, the present embodiment is not limited thereto.

A buffer layer 130 is disposed on the substrate 100 to cover the first conductive layer. The buffer layer 130 can prevent diffusion of ions or impurities from the substrate 100 and block moisture penetration.

The active layer 140 can be formed on the buffer layer 130. The active layer 140 can be formed of a silicon-based semiconductor material or an oxide-based semiconductor material. The active layer 140 can include a source region and a drain region which include p-type or n-type impurities, and a channel formed between the source region and the drain region. One region of the active layer 140 can form an intermediate electrode 144 of the storage capacitor Cst. The intermediate electrode 144 can be disposed such that at least one region thereof overlaps the lower electrode 122.

A gate insulating layer 150 can be disposed to correspond to a region where a below-described gate electrode 161 is to be formed. For example, the gate insulating layer 150 can be formed on the channel of the active layer 140.

A second conductive layer can be disposed on the gate insulating layer 150. The second conductive layer can include the gate electrode 161. The gate electrode 161 can be disposed at a position corresponding to the channel of the active layer 140.

An interlayer insulating layer 170 can be formed on the second conductive layer. A third conductive layer can be formed on the interlayer insulating layer 170. The third conductive layer can include a source electrode 181 and a drain electrode 182. The source electrode 181 and the drain electrode 182 can be connected to the source region and the drain region of the active layer 140 respectively through a contact hole which passes through the interlayer insulating layer 170. The source electrode 181 and the drain electrode 182 can be formed as a single layer or multiple layers.

The source electrode 181, the drain electrode 182, the gate electrode 161, and the active layer 140 corresponding to them can constitute a transistor. In FIG. 3, the driving transistor DT in which the source electrode 181 is connected to the anode electrode 210 of the light emitting device LD is shown as an example.

The third conductive layer can further include an upper electrode 183 of the storage capacitor Cst. In the embodiment, the upper electrode 183 can be integrally formed with the drain electrode 182 of the driving transistor DT. However, the present embodiment is not limited thereto. An electric field can be formed between the intermediate electrode 144 formed in the active layer 140 and the upper electrode 183 formed in the third conductive layer and can function as the storage capacitor Cst.

The third conductive layer can further include a bridge electrode 184. The bridge electrode 184 is connected to the auxiliary wiring 123 through a contact hole which passes through the interlayer insulating layer 170 and the buffer layer 130.

The circuit element layer can be covered by a passivation layer 191 and an overcoat layer 192. The passivation layer 191 can be an insulating layer to protect the devices thereunder, and the overcoat layer 192 can be a planarization layer for reducing a step difference in the structure thereunder.

The light emitting device layer is formed on the overcoat layer 192 and includes the light emitting devices LDs. The light emitting device LD includes the anode electrode 210, a light emitting layer 220, and a cathode electrode 230.

The anode electrode 210 is formed on the overcoat layer 192. The anode electrode 210 is connected to the driving transistor DT through a first via hole VIA1 which passes through the overcoat layer 192 and the passivation layer 191. The anode electrode 210 can be formed of a transparent conductive material, such as indium tin oxide (ITO), indium zinc oxide (IZO), zinc oxide (ZnO), etc. When the anode electrode 210 is a reflective electrode, the anode electrode 210 can be formed as a triple layer composed of a transparent conductive layer/a reflective layer (a metal oxide layer)/a transparent conductive layer. For example, the anode electrode 210 can be formed as a triple layer including ITO/Ag/ITO.

A bank 250 can be formed on the overcoat layer 192. The bank 250 can be formed to expose some regions of the anode electrode 210, for example, a central region and to cover the remaining region, for example, edges of the anode electrode 210. The exposed region of the anode electrode 210 which is not covered by the bank 250 can be defined as a light emitting area EA of the pixel PX.

In the embodiment, the bank 250 can have a structure in which a hydrophilic bank 251 and a hydrophobic bank 252 are stacked.

The hydrophilic bank 251 can be formed to expose the central region of an auxiliary anode electrode 212 and an anode electrode 211 and to cover edges of the auxiliary anode electrode 212 and the anode electrode 211. The exposed region of the anode electrode 210 which is not covered by the hydrophilic bank 251 can be defined as the light emitting area EA. The hydrophilic bank 251 is formed of a hydrophilic inorganic insulating material, such as silicon oxide (SiO2) or silicon nitride (SiNx), so that a solution spreads well in the formation of the light emitting layer 220, which will be described later.

The hydrophobic bank 252 can be formed in a partial region on the hydrophilic bank 251. The hydrophobic bank 252 can be disposed between pixel rows and can partition the pixel rows. The hydrophobic bank 252 is formed such that at least one region, for example, an upper region, has hydrophobicity, thereby preventing color mixing between the pixel rows.

The light emitting layer 220 is formed on the exposed region of the anode electrode 210 surrounded by the bank 250. The light emitting layer 220 can be formed through a solution process as shown. For example, a solution for forming the light emitting layer 220 within the light emitting area EA can be applied. The solution can be manufactured by mixing organic materials constituting the light emitting layer 220 with a solvent. The solution can be jetted to the light emitting area through an inkjet apparatus having a nozzle mounted on an inkjet head. The applied ink is dried to form the light emitting layer 220. In the light emitting layer 220 formed through the solution process, the surface of the central region can be lower than the surface of the edge region.

In the embodiment, a hole transport layer (HTL), a hole injection layer (HIL), or the like can be disposed between the light emitting layer 220 and the anode electrode 210.

The cathode electrode 230 is formed on the light emitting layer 220. The cathode electrode 230 can cover the light emitting layer 220 and can be formed widely on a display area AA. The cathode electrode 230 can be formed of a transparent conductive material (TCO) or a semi-transmissive conductive material which is capable of transmitting light.

An electron transport layer (ETL) 240 can be disposed between the cathode electrode 230 and the light emitting layer 220. The electron transport layer 240 serves to smoothly transfer electrons injected from the cathode electrode 230 to the light emitting layer 220.

In the present embodiment, the pixel PX further includes an auxiliary electrode 260 for electrically connecting the cathode electrode 230 and the second power line PL2. The auxiliary electrode 260 is formed on the same layer as the anode electrode 210 and can be disposed in an auxiliary electrode contact part CA of a non-light emitting area NEA. The auxiliary electrode 260 can be connected to the bridge electrode 184 through a second via hole VIA2 which passes through the overcoat layer 192 and the passivation layer 191. Since the bridge electrode 184 is connected to the second power line PL2 via the auxiliary wiring 123, the auxiliary electrode 260 can be electrically connected to the second power line PL2 (e.g., see FIG. 1).

The auxiliary electrode 260 is formed of the same material as the anode electrode 210 and can be formed in the same process. In the embodiment, the auxiliary electrode 260 can be formed of a triple layer composed of ITO/Ag/ITO in the same manner as the anode electrode 210.

In the non-light emitting area NEA, the bank 250 can be formed to expose a region of the auxiliary electrode 260. Since the cathode electrode 230 is formed widely in the display area AA, the cathode electrode 230 covers the exposed region of the auxiliary electrode 260. The cathode electrode 230 can be electrically connected to the second power line PL2 via the auxiliary electrode 260, the bridge electrode 184, and the auxiliary wiring 123.

When the auxiliary electrode 260 has the same or similar layered structure as the anode electrode 210, the auxiliary electrode 260 can have a structure in which transparent conductive layer/reflective layer/transparent conductive layer are stacked. Since the transparent conductive layer has a relatively low electrical conductivity, a resistance between the cathode electrode 230 and the auxiliary electrode 260 can increase. Accordingly, the low potential driving voltage ELVSS may not be easily supplied between the cathode electrode 230 and the second power line PL2.

In the embodiment, in order to solve the above problem, a structure is provided, in which at least one electrode hole H is formed in the auxiliary electrode 260 and a metal layer 600 is stacked under the auxiliary electrode 260. In the embodiment, in this structure, the cathode electrode 230 and the auxiliary electrode 260 can be stably contacted by using reflow of the electron transport layer 240 (e.g., melting of the electron transport layer 240).

An encapsulation layer 300 can be formed on the cathode electrode 230. The encapsulation layer 300 serves to prevent external moisture from penetrating into the light emitting layer 220. The encapsulation layer 300 can be formed of an inorganic insulating material or can have a structure in which an inorganic insulating material and an organic insulating material are alternately stacked, and is not limited thereto.

A cover substrate 410 can be formed on the encapsulation layer 300. The cover substrate 410 can be made of the same material as the substrate 110. The cover substrate 410 can be adhered to the encapsulation layer 300 through an adhesive or the like.

In various embodiments, a color filter 420 can be further formed between the encapsulation layer 300 and the cover substrate 410. The color filter 420 can be disposed in the light emitting area EA. The color filter 420 is a wavelength-selective optical filter that transmits light in a specific wavelength band and blocks light in another specific wavelength band, and thus, selectively transmits incident light only in a partial wavelength band. The color filter 420 is composed of a photosensitive resin including a colorant such as pigment or dye. Light which is generated by the light emitting device LD and passes through the color filter 420 can have any one of red, green, and blue colors. When the pixel PX represents a white color, the color filter 420 can be omitted for the corresponding pixel PX.

Figure 4:
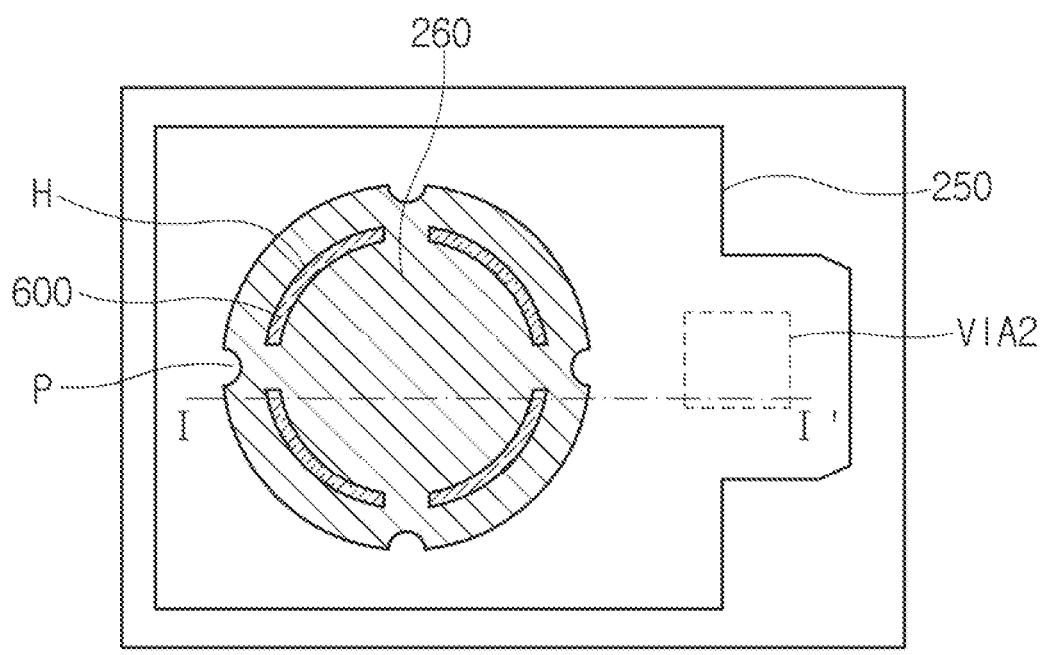
FIG. 4 shows an embodiment of an enlarged plan view of an auxiliary electrode contact part according to an embodiment of the present disclosure.
Figure 5:
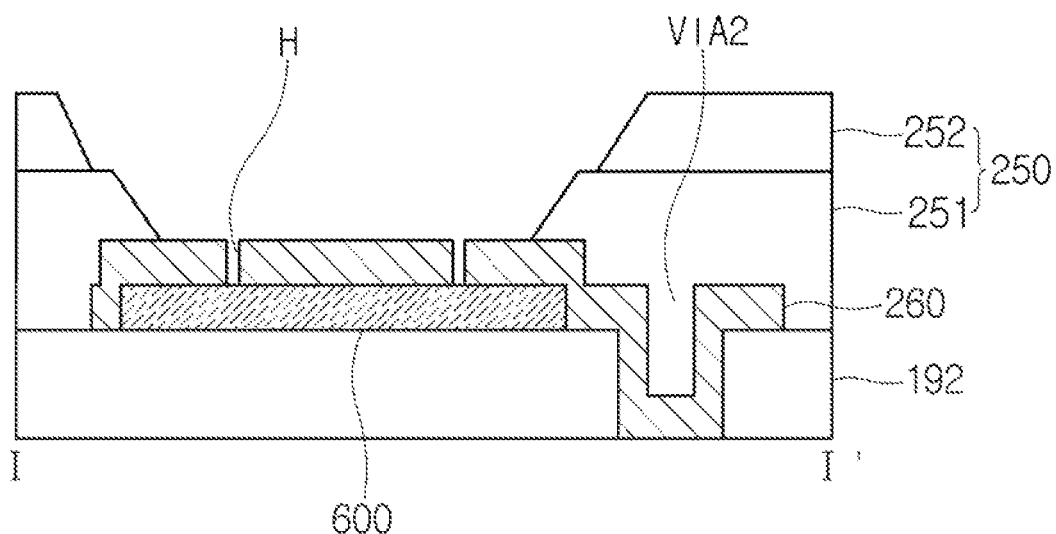
FIG. 5 is a cross sectional view taken along line I-I' of FIG. 4 according to an embodiment of the present disclosure.

FIG. 4 shows an embodiment of an enlarged plan view of the auxiliary electrode contact part. FIG. 5 is a cross sectional view taken along line I-I' of FIG. 4.

Specifically, referring to FIGS. 4 and 5, a metal layer 600 can be formed on the overcoat layer 192 in this embodiment. The metal layer 600 can be made of a metal having high laser absorptance, for example, molybdenum titanium (MoTi).

The auxiliary electrode 260 can be formed to cover the metal layer 600. The auxiliary electrode 260 can be formed as a triple layer composed of a transparent conductive layer 261 (a first transparent conductive layer)/a reflective layer 262/a transparent conductive layer 263 (a second transparent conductive layer). In the embodiment, the reflective layer 262 can be made of silver (Ag) or a silver alloy, which has a high ionization degree.

The auxiliary electrode 260 can include at least one electrode hole H which exposes a region of the metal layer 600. The electrode hole H passes through the triple layer of the auxiliary electrode 260 and exposes the metal layer 600. The transparent conductive layer 261/the reflective layer 262/the transparent conductive layer 263 which constitute the auxiliary electrode 260 can be exposed at the sidewall of the electrode hole H.

In the embodiments shown in FIGS. 4 and 5, four electrode holes H are shown. Each of the electrode holes H has a curved shape on a plane, and both ends of the electrode holes H can be disposed adjacent to other electrode holes H, respectively. However, the shape and number of the electrode holes H are not limited thereto.

In the embodiment, the bank 250 can include at least one protrusion P which is formed toward the inside of the auxiliary electrode 260. The protrusion P protrudes from one side surface of the bank 250 toward the inside of the auxiliary electrode 260 and can have a semicircular planar cross-section. However, the present embodiment is not limited thereto, and the planar cross-section of the protrusion P can have various shapes, such as a triangle, a quadrangle, a trapezoid, etc. The protrusion P performs a function of pushing the melted electron transport layer 240 toward the electrode hole H such that the melted electron transport layer 240 can more easily flow into the electrode hole H during a reflow process.

Figure 6:
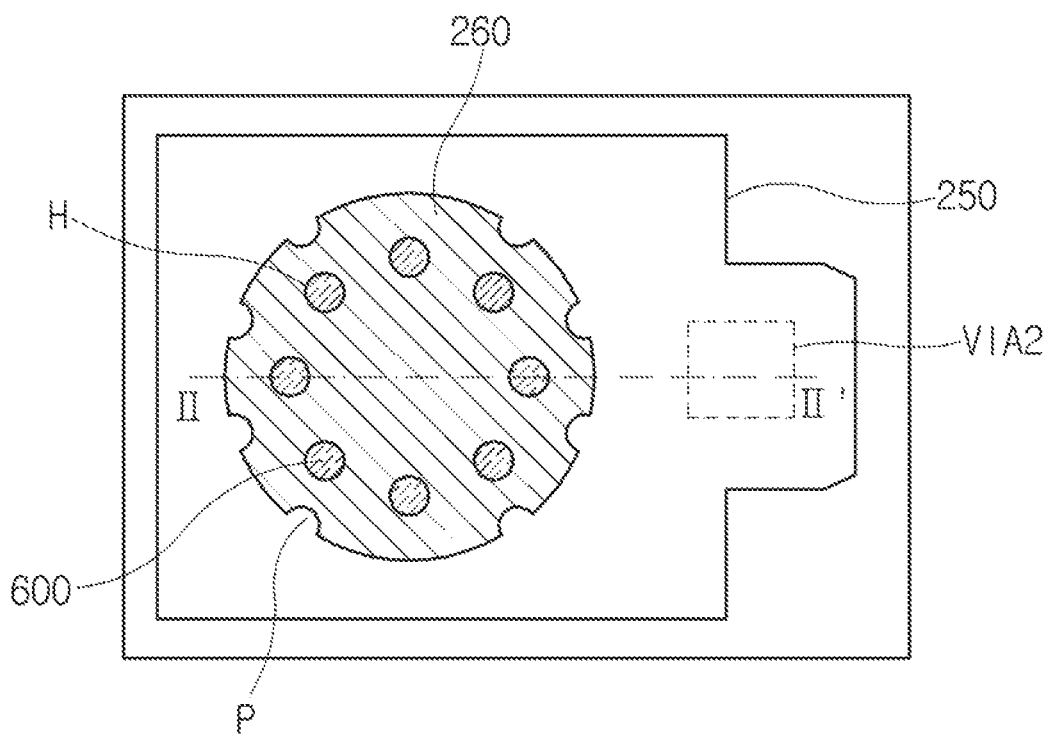
FIG. 6 shows an enlarged plan view of an area AA of FIG. 3 according to another embodiment of the present disclosure.
Figure 7:
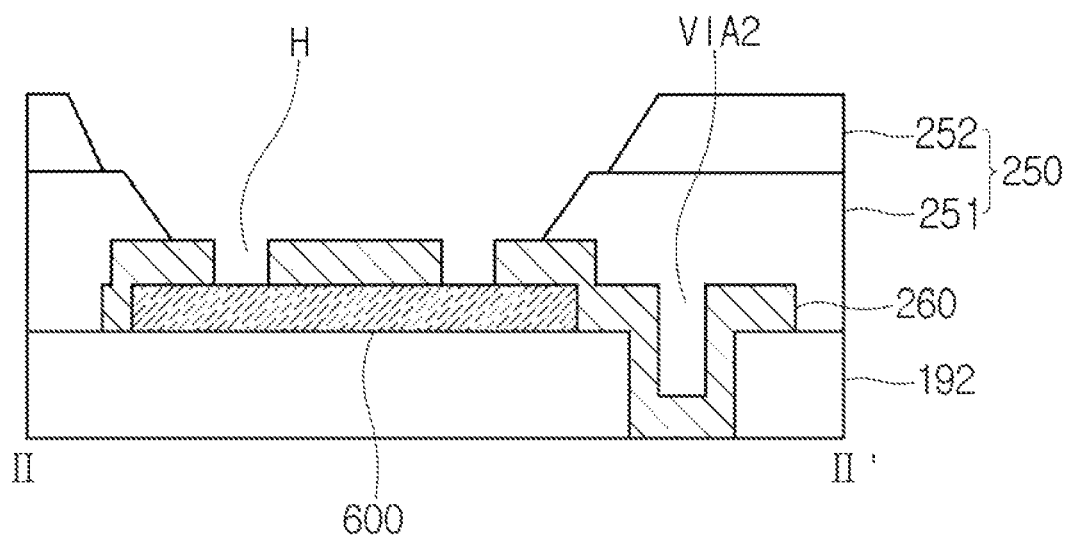
FIG. 7 is a cross sectional view taken along line II-IF of FIG. 6 according to an embodiment of the present disclosure.

FIG. 6 shows another embodiment of an enlarged plan view of the area AA of FIG. 3. FIG. 7 is a cross sectional view taken along line II-II' of FIG. 6.

FIGS. 6 and 7 show another embodiment of the electrode hole H. In FIGS. 6 and 7, the electrode hole H can have a circular shape (e.g., eight individual holes). In other embodiments, the electrode hole H can have an elliptical shape or various polygonal shapes. In FIGS. 6 and 7, eight electrode holes H are disposed in a circular shape such that both sides thereof are adjacent to other electrode holes H. In another embodiment, fewer or more electrode holes H than eight can be formed and can be regularly or irregularly arranged.

There is no particular limitation on the shape, size, and arrangement of the electrode hole H.

In the embodiment shown in FIG. 6, the bank 250 can include at least one protrusion P which is formed toward the inside of the auxiliary electrode 260. The protrusion P protrudes from one side surface of the bank 250 toward the inside of the auxiliary electrode 260 and can have a semicircular planar cross-section. However, the present embodiment is not limited thereto, and the planar cross-section of the protrusion P can have various shapes such as a triangle, a quadrangle, a trapezoid, etc. The protrusion P performs a function of pushing the melted electron transport layer 240 toward the electrode hole H such that the melted electron transport layer 240 can more easily flow into the electrode hole H during a reflow process.

Figure 8:
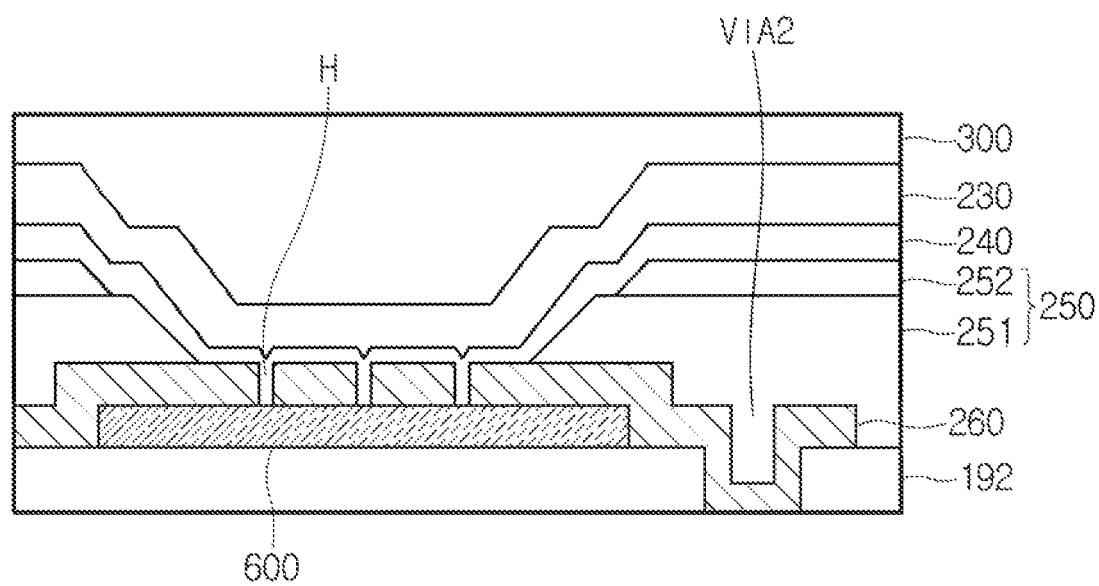
FIG. 8 shows an enlarged cross sectional view of the auxiliary electrode contact part according to an embodiment of the present disclosure.
Figure 9:
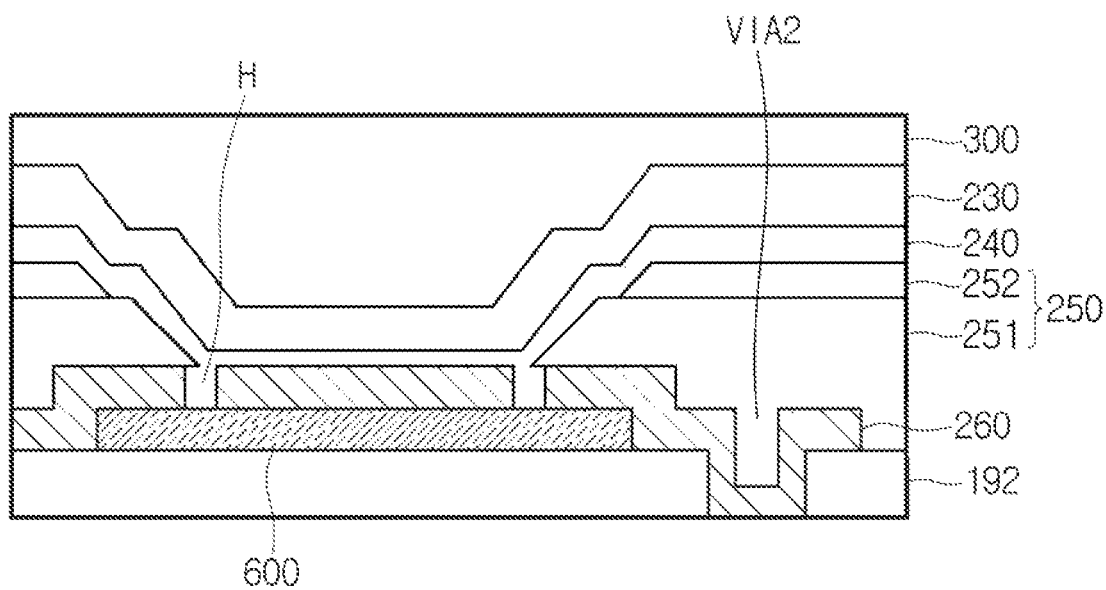
FIG. 9 shows an enlarged cross sectional view of the auxiliary electrode contact part according to another embodiment of the present disclosure.

FIG. 8 shows an embodiment of an enlarged cross sectional view of the auxiliary electrode contact part. FIG. 9 shows another embodiment of an enlarged cross sectional view of the auxiliary electrode contact part.

The bank 250 is formed to expose a central region of the auxiliary electrode 260 and to cover edges of the auxiliary electrode 260. For example, as shown in FIG. 8, the bank 250 can be formed to cover a peripheral region other than a central region in which the electrode holes H are formed. Alternatively, the bank 250 can be formed to cover some regions of the electrode hole H as shown in FIG. 9.

The electron transport layer 240 can be formed in the exposed region which is not covered by the bank 250. The electron transport layer 240 can be connected to the metal layer 600 through the electrode hole H (e.g., the electron transport layer 240 and the metal layer 600 can be melted together and fuse in the electrode hole H and/or in an area adjacent thereto).

In the embodiment, the electron transport layer 240 can be filled in the electrode hole H through a reflow process. The reflow process can be performed, for example, by irradiating a laser from the top or bottom of the substrate 110. Here, the laser is efficiently absorbed by the metal layer 600, so that heat can be transferred to the electron transport layer 240. Then, the electron transport layer 240 can be melted and guided into the electrode hole H.

Since a portion of the electron transport layer 240 flows into the electrode hole H by the reflow process, the thickness of the region of the electron transport layer 240, which covers the auxiliary electrode 260, can be less than the thickness of the region of the electron transport layer 240, which covers the bank 250 (e.g., see the melted thinner portion of the electron transport layer 240 in FIG. 8, in which the melted electron transport layer 240 get pulls down into the electrode holes H and makes better contact with the auxiliary electrode 260 and the metal layer 600). Also, on the auxiliary electrode 260, the electron transport layer 240 is formed on the electrode hole H and the height of the surface of the electron transport layer 240 is less than that of the periphery. For example, the electron transport layer 240 can have a concave portion in regions corresponding to the electrode holes H, and a first height of a first portion of the electron transport layer 240 in an area overlapping with the metal layer 600 can be less than a second height of the electron transport layer 240 in an area outside of and not overlapping with the metal layer 600.

The electron transport layer 240 can be in direct contact with the reflective layer 262 exposed through the sidewall of the electrode hole H (e.g., see FIG. 3). Since a metal constituting the reflective layer 262 has a high ionization degree and a higher electrical conductivity than those of the transparent conductive layers 261 and 262, the resistance between the cathode electrode 230 and the auxiliary electrode 260 is reduced, and the low potential driving voltage ELVSS can be efficiently transferred.

Hereinafter, a method of manufacturing the display device having the above structure will be described in detail.

FIGS. 10 to 15 show a manufacturing method of the display device according to an embodiment of the present disclosure. In FIGS. 10 to 15, for convenience of description, the illustration of layers under the overcoat layer 192 are omitted. However, under the overcoat layer 192, as described with reference to FIG. 3, the circuit elements, the auxiliary wiring 123, the bridge electrode 184, and the like can be formed.

Figure 10:
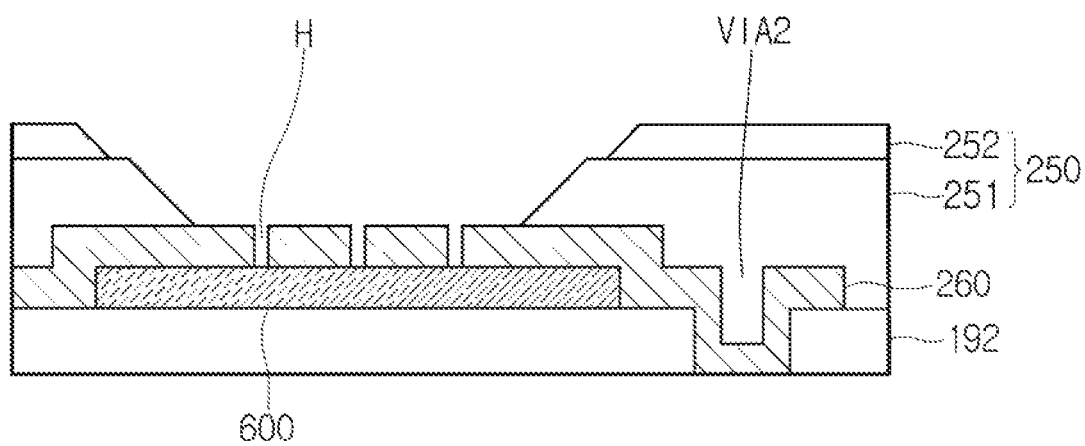
FIGS. 10 to 15 show a manufacturing method of the display device according to an embodiment of the present disclosure.

Referring to FIG. 10, the metal layer 600 is formed on the overcoat layer 192 in the auxiliary electrode contact part CA of the non-light emitting area NEA. The metal layer 600 can be made of a metal having high laser absorptance, for example, molybdenum titanium (MoTi).

Also, the auxiliary electrode 260 is further formed on the overcoat layer 192. The auxiliary electrode 260 can be formed to cover the metal layer 600. Also, the auxiliary electrode 260 is connected to the bridge electrode 184.

The auxiliary electrode 260 can be formed as a triple layer composed of the transparent conductive layer 261/the reflective layer 262/the transparent conductive layer 263 (e.g., also see FIG. 3). The transparent conductive layers 261 and 263 can be made of, for example, ITO, and the reflective layer 262 can be made of, for example, a metallic material such as silver or a silver alloy. At least one electrode hole H is formed in the auxiliary electrode 260. The transparent conductive layer 261/the reflective layer 262/the transparent conductive layer 263 which constitute the auxiliary electrode 260 can be exposed at the sidewall of the electrode hole H.

After the transparent conductive layer 261/the reflective layer 262/the transparent conductive layer 263 are stacked in the order listed, the auxiliary electrode 260 is formed by collectively etching (e.g., wet etching) the triple layer in a state where a mask including a pattern corresponding to the electrode hole H has been applied.

The bank 250 is formed on the overcoat layer 192. The bank 250 can be formed to expose some regions of the auxiliary electrode 260, for example, a central region and to cover the remaining region, for example, edges of the auxiliary electrode 260. Here, the bank 250 may not cover the electrode hole H formed in the auxiliary electrode 260 or can cover only some regions.

At least a portion of the surface of the bank 250 can be formed to have hydrophobicity. For example, the bank 250 can be formed by applying a solution in which a hydrophobic material such as fluorine (F) is mixed with an organic insulating material and then by a photolithography process. The hydrophobic material such as fluorine can move to the top of the bank 250 by light irradiated during the photolithography process, and accordingly, the top surface of the bank 250 can have a hydrophobic property and the remaining portion can have a hydrophilic property. When the light emitting layer 220 is formed through a solution process, the hydrophobic bank 250 can serve as a dam to prevent ink from being mixed between the light emitting areas EA.

Figure 11:
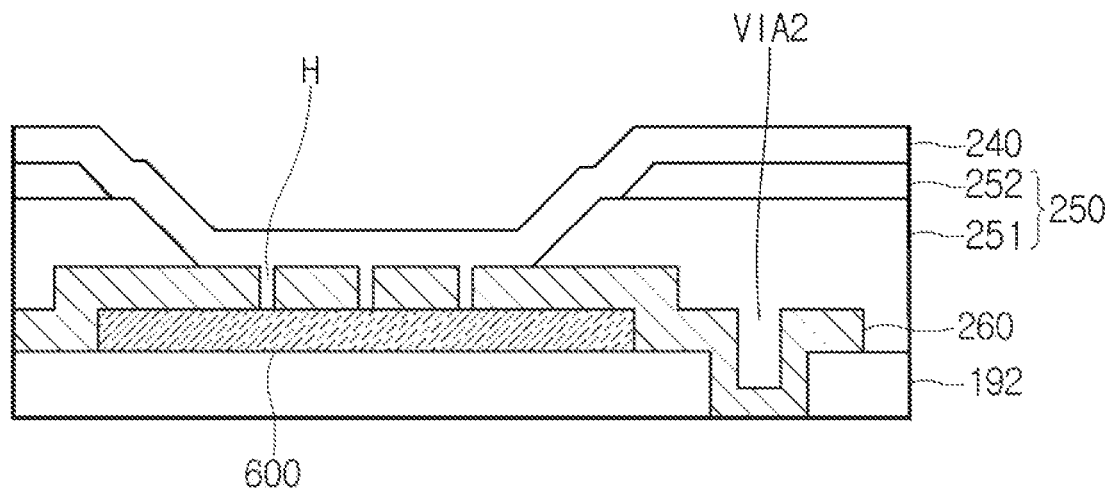

Referring to FIG. 11, the electron transport layer 240 is formed. The electron transport layer 240 is widely formed in the display area AA, thereby covering the bank 250 and the auxiliary electrode 260.

The electron transport layer 240 can be formed by an evaporation deposition method such as thermal deposition or by a physical vapor deposition method, such as a sputtering method. Here, an organic material constituting the electron transport layer 240 can be formed on the electrode hole H without filling the electrode hole H in accordance with step coverage characteristics.

Figure 12:
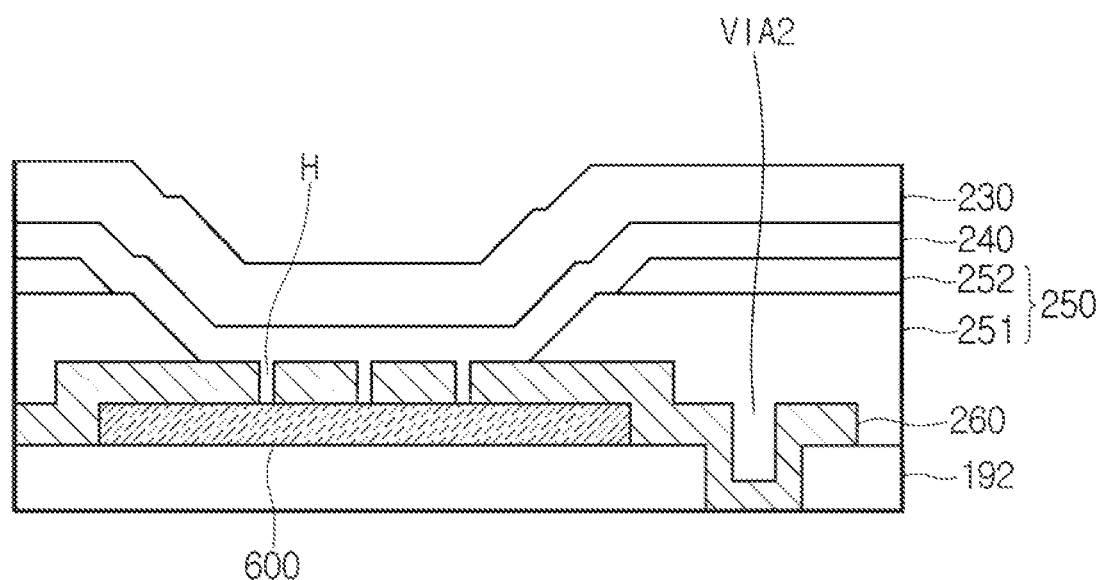
Figure 13:
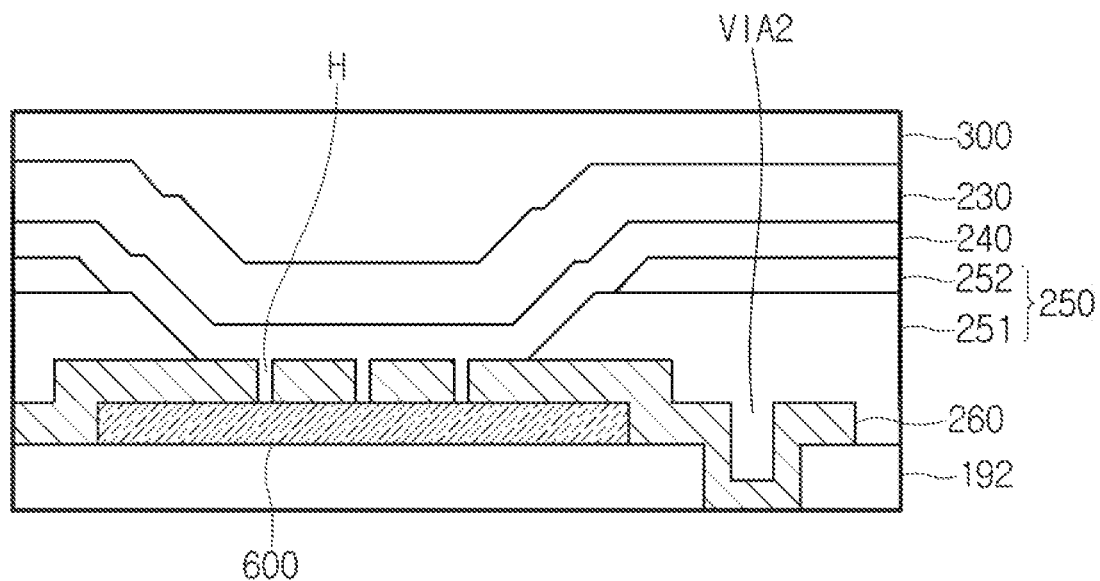

Referring to FIG. 12, a cathode electrode 230 is formed on the electron transport layer 240. The cathode electrode 230 can be widely formed in the display area AA. The cathode electrode 230 can be formed by an evaporation deposition method such as thermal evaporation or a physical vapor deposition method such as a sputtering method. Referring to FIG. 13, an encapsulation layer 300 can be formed on the cathode electrode 230.

Figure 14:
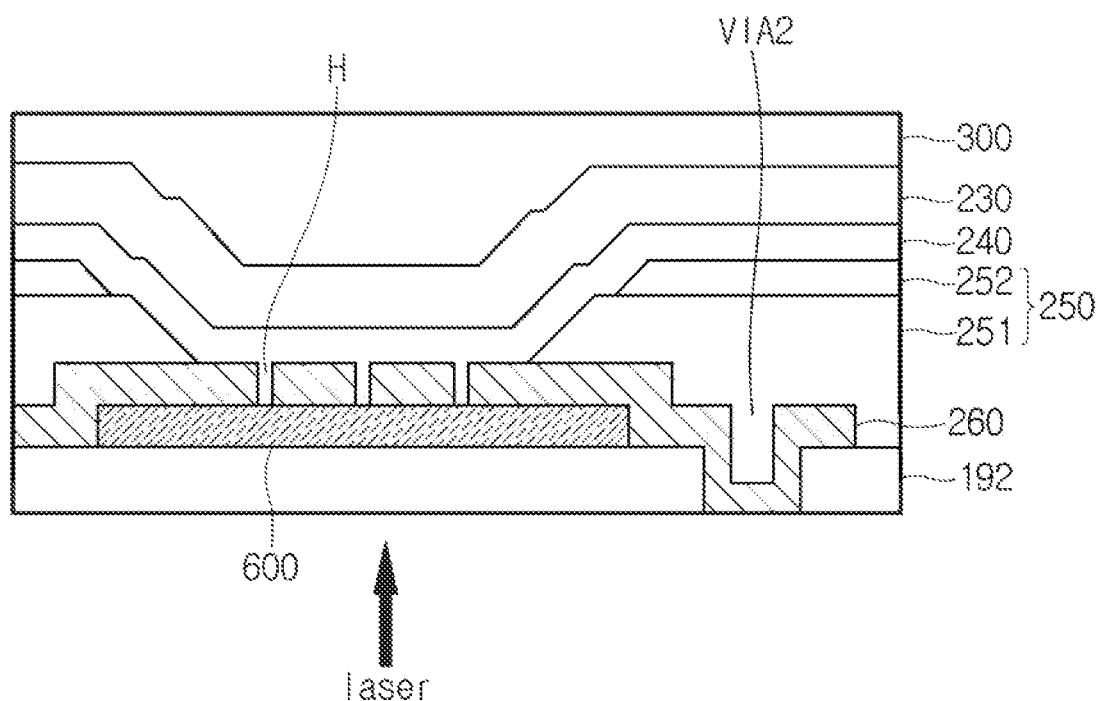

Then, a reflow process for the electron transport layer 240 can be performed. For example, as shown in FIG. 14, a laser can be irradiated from below (or above) the display panel 50. Since the metal layer 600 is formed of a metal having high laser absorptance, the metal layer 600 absorbs efficiently the laser irradiated from the outside. Then, energy by the laser can easily reach the auxiliary electrode 260 directly connected to the metal layer 600 and the electron transport layer 240 directly connected to the auxiliary electrode 260 (e.g., metal layer 600 can heat up due to the laser, and then transfer that heat to the auxiliary electrode 20 for better melting).

Figure 15:
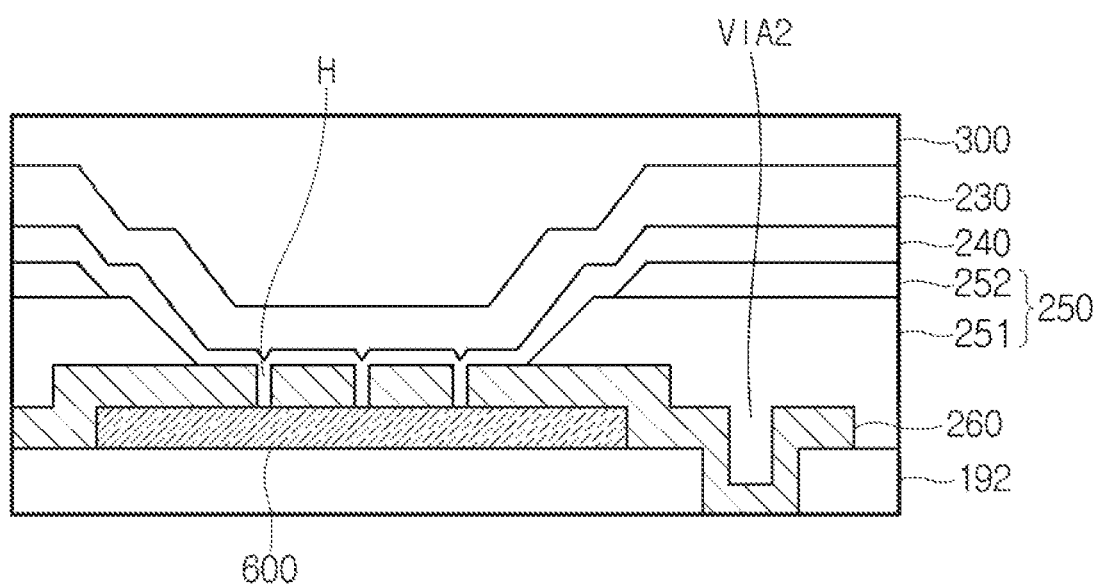

At least a portion of the electron transport layer 240 is melted by the energy of the laser transmitted through the metal layer 600 and the auxiliary electrode 260. Then, as shown in FIG. 15, the molten electron transport layer 240 can be guided into the electrode hole H and may fill the electrode hole H (e.g., as the electron transport layer 240 is melted, portions of the electron transport layer 240 can be pulled down into the electrode holes H and fuse with inner side surfaces of the transparent conductive layer 261/the reflective layer 262/the transparent conductive layer 263 as well as the upper surface of metal layer 600). Here, the electron transport layer 240 can be in direct contact with the reflective layer 262 exposed on the side of the electrode hole H.

As described above, as the electron transport layer 240 directly contacts the reflective layer 262, an electrical connection between the cathode electrode 230 and the auxiliary electrode 260 can be stably formed. The cathode electrode 230 can be stably connected to the second power line PL2 via the auxiliary electrode 260.

According to the display device and the method manufacturing thereof according to the embodiments, it is possible to facilitate the connection between the cathode electrode and the auxiliary electrode by maximizing laser absorptance through the metal layer and to reduce the resistance between the cathode electrode and the auxiliary electrode.

According to the display device and the method manufacturing thereof according to the embodiments, the connection between the cathode electrode and the auxiliary electrode is stabilized, so that power applied through an auxiliary wire is stably supplied to the cathode electrode.

Accordingly, the display device and the method manufacturing thereof according to the embodiments can improve operating characteristics of the display device and reduce power consumption.

It can be understood by those skilled in the art that the embodiments can be embodied in other specific forms without departing from its spirit or essential characteristics. Therefore, the foregoing embodiments and advantages are merely examples and are not to be construed as limiting the present invention. It can be understood by those skilled in the art that the embodiments can be embodied in other specific forms without departing from its spirit or essential characteristics.

Therefore, the foregoing embodiments and advantages are merely examples and are not to be construed as limiting the present invention. The scopes of the embodiments are described by the scopes of the following claims rather than by the foregoing description. All modification, alternatives, and variations derived from the scope and the meaning of the scope of the claims and equivalents of the claims should be construed as being included in the scopes of the embodiments.

What is claimed is:

1. A display device comprising:
   a substrate including a light emitting area and a non-light emitting area;
   an anode electrode disposed in the light emitting area;
   a metal layer disposed in the non-light emitting area and connected to a first driving power;
   an auxiliary electrode disposed on the metal layer and including at least one electrode hole exposing the metal layer;
   a bank disposed on an edge region of the anode electrode and an edge region of the auxiliary electrode;
   a light emitting layer disposed on a region of the anode electrode exposed by the bank;
   an electron transport layer disposed on the light emitting layer and the auxiliary electrode; and
   a cathode electrode disposed on the electron transport layer,
   wherein the electron transport layer is in direct contact with the metal layer through the at least one electrode hole.

2. The display device of claim 1, wherein a surface of an edge region of the light emitting layer that is adjacent to the bank is higher than a surface of a central region of the light emitting layer.

3. The display device of claim 1, wherein the bank covers the edge region of the auxiliary electrode and exposes a central region of the auxiliary electrode.

4. The display device of claim 3, wherein the bank does not overlap with all or some regions of the at least one electrode hole.

5. The display device of claim 3, wherein the electron transport layer covers the central region of the auxiliary electrode and the bank.

6. The display device of claim 5, wherein a first portion of the electron transport layer overlapping with the auxiliary electrode has a first thickness, and
   wherein a second portion of the electron transport layer overlapping with the bank has a second thickness greater than the first thickness.

7. The display device of claim 5, wherein a third portion of the electron transport layer overlapping with the at least one electrode hole has a first height, and
   wherein a fourth portion of the electron transport layer adjacent to the third portion in an area not overlapping with the at least one electrode hole has a second height greater than the first height.

8. The display device of claim 1, wherein the metal layer includes molybdenum titanium.

9. The display device of claim 1, wherein the at least one electrode hole has a curved shape on a plane, and opposite ends of the at least one electrode hole are disposed adjacent to other electrode holes, respectively.

10. The display device of claim 1, wherein the at least one electrode hole has a circular shape, an elliptical shape or polygonal shapes, and opposite sides of the at least one electrode hole are disposed adjacent to other electrode holes.

11. The display device of claim 1, wherein the auxiliary electrode comprises:
    a first layer including a transparent conductive material;
    a second layer including a metal oxide; and
    a third layer including the transparent conductive material.

12. The display device of claim 11, wherein the electron transport layer is in direct contact with a portion of the second layer exposed through a sidewall of the at least one electrode hole.

* * * * *